US011869626B2

(12) United States Patent
Kim et al.

(10) Patent No.: US 11,869,626 B2
(45) Date of Patent: Jan. 9, 2024

(54) INTERNAL AND EXTERNAL DATA TRANSFER FOR STACKED MEMORY DIES

(71) Applicant: Micron Technology, Inc., Boise, ID (US)

(72) Inventors: Kang-Yong Kim, Boise, ID (US); Hyunyoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 36 days.

(21) Appl. No.: 17/502,792

(22) Filed: Oct. 15, 2021

(65) Prior Publication Data

US 2023/0121992 A1 Apr. 20, 2023

(51) Int. Cl.
*G11C 7/10* (2006.01)

(52) U.S. Cl.
CPC ............ *G11C 7/1063* (2013.01); *G11C 7/109* (2013.01); *G11C 7/1066* (2013.01); *G11C 7/1093* (2013.01)

(58) Field of Classification Search
CPC ................................ G11C 7/1063; G11C 7/10
USPC ........................................................ 365/191
See application file for complete search history.

(56) References Cited

U.S. PATENT DOCUMENTS

| 2010/0091537 | A1* | 4/2010 | Best ...................... G11C 11/406 365/220 |
| 2014/0185352 | A1* | 7/2014 | Chow ...................... G11C 8/12 365/63 |
| 2014/0252640 | A1* | 9/2014 | Kwak ................. H01L 25/0652 257/773 |
| 2017/0364469 | A1* | 12/2017 | Crisp ..................... G11C 5/025 |
| 2020/0075548 | A1 | 3/2020 | Kim et al. |
| 2021/0200464 | A1* | 7/2021 | Keeth ................... G06F 3/0655 |

\* cited by examiner

*Primary Examiner* — Muna A Techane
(74) *Attorney, Agent, or Firm* — Brooks, Cameron & Huebsch, PLLC

(57) ABSTRACT

Some memory dies in a stack can be connected externally to the stack and other memory dies in the stack can be connected internally to the stack. The memory dies that are connected externally can act as interface dies for other memory dies that are connected internally thereto. The external connections can be used for transmitting signals indicative of data to and/or from the memory dies while the memory dies in the stack can be connected by a cascading connection for transmission of other signals such as command, address, power, ground, etc.

15 Claims, 7 Drawing Sheets

INTERNAL AND EXTERNAL DATA TRANSFER FOR STACKED MEMORY DIES

TECHNICAL FIELD

The present disclosure relates generally to semiconductor memory and methods, and more particularly, to apparatuses, systems, and methods for internal and external data transfers for stacked memory dies.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, ferroelectric random access memory (FeRAM), and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system. A controller may be used to manage the transfer of data, commands, and/or instructions between the host and the memory devices.

DETAILED DESCRIPTION

Figure 1:
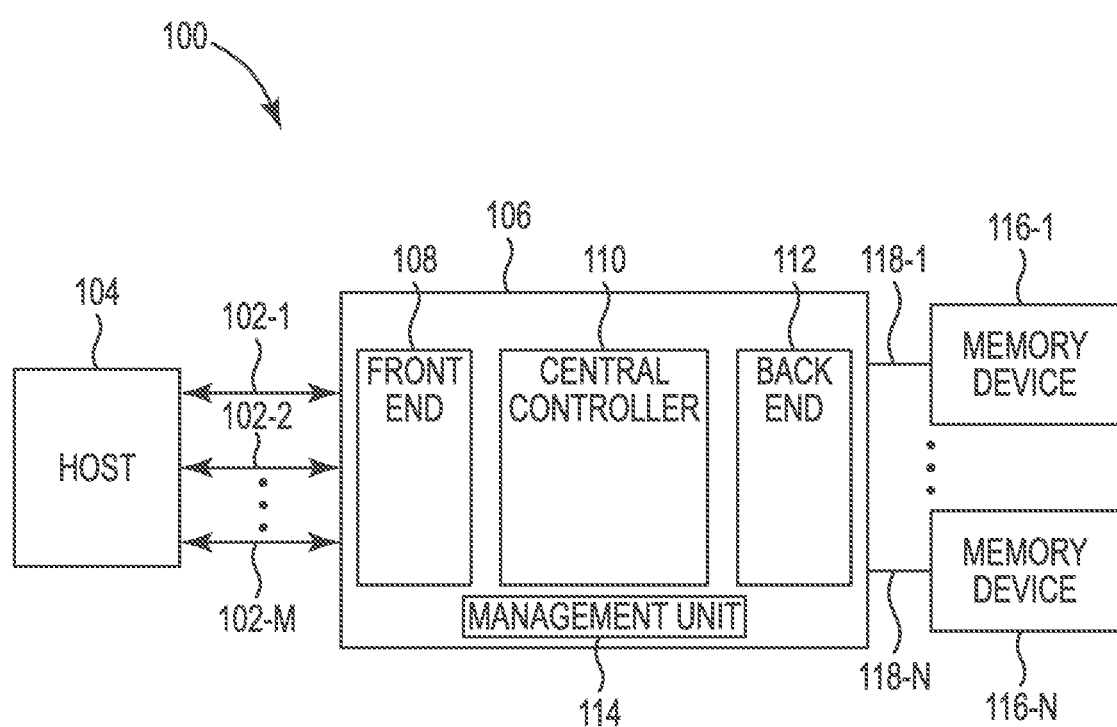
FIG. 1 is a block diagram of a computing system in accordance with a number of embodiments of the present disclosure.

Systems, apparatuses, and methods related to internal and external data transfers for stacked memory dies are described. In some previous approaches to stacked memory dies, the signaling for data transfer and/or command/address (CA) signaling was arranged such that each memory die can be controlled independently by the control circuitry by direct communication of signals between the control circuitry and each memory die. In some other approaches to stacked memory dies, the signaling can be routed via through-silicon vias (TSVs) to each memory die and a control die (e.g., for a hybrid memory cube). In some approaches a primary memory die/secondary memory die communication protocol (sometimes referred to in the art as master/slave) is used to communicate with control circuitry and/or a host. However, such approaches involve a significant quantity of internal control signals for the memory dies.

Aspects of the present disclosure address the above and other challenges for memory systems including stacked memory dies. For example, some memory dies in a stack can be connected externally to the stack and other memory dies in the stack can be connected internally to the stack. The memory dies that are connected externally can act as interface dies for other memory dies that are connected internally thereto. In some embodiments, the external connections are used for transmitting signals indicative of data to and/or from the memory dies while the memory dies in the stack are connected by a cascading connection for transmission of other signals such as command, address, power, ground, etc.

In some embodiments, the memory system can be a compute express link (CXL) compliant memory system. The host interface can be managed with CXL protocols and be coupled to the host via a peripheral component interconnect express (PCIe) interface. CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost. CXL is designed to be an industry open standard interface for high-speed communications, as accelerators are increasingly used to complement CPUs in support of emerging applications such as artificial intelligence and machine learning. CXL technology is built on the PCIe infrastructure, leveraging PCIe physical and electrical interfaces to provide advanced protocol in areas such as input/output (I/O) protocol, memory protocol (e.g., initially allowing a host to share memory with an accelerator), and coherency interface.

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 336 may reference element "36" in FIG. 3, and a similar element may be referenced as 536 in FIG. 5. Analogous elements within a Figure may be referenced with a hyphen and extra numeral or letter. See, for example, elements 116-1, . . . , 116-N in FIG. 1. Such analogous elements may be generally referenced without the hyphen and extra numeral or letter. For example, elements 116-1, ..., 116-N may be collectively referenced as 116. As used herein, the designators "M", "N", and "P", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of a computing system 100 in accordance with a number of embodiments of the present disclosure. The computing system 100 can include a memory controller 106 having a front end portion 106, a central controller portion 110, and a back end portion 112. The computing system 100 can include a host 104 and memory devices 116-1, ..., 116-N coupled to the memory controller 106.

The front end portion 106 includes an interface and interface management circuitry to couple the memory controller 106 to the host 104 through input/output (I/O) lanes 102-1, 102-2, ..., 102-M and circuitry to manage the I/O lanes 102. There can be any quantity of I/O lanes 102, such as eight, sixteen, or another quantity of I/O lanes 102. In some embodiments, the I/O lanes 102 can be configured as a single port. In at least one embodiment, the interface between the memory controller 106 and the host 104 can be a PCIe physical and electrical interface operated according to a CXL protocol.

The central controller portion 110 can include and/or be referred to as data management circuitry. The central controller portion 110 can control, in response to receiving a request from the host 104, performance of a memory operation. Examples of the memory operation include a read operation to read data from a memory device 116 or a write operation to write data to a memory device 116.

The central controller portion 110 can generate error detection information and/or error correction information based on data received from the host 104. The central controller portion 110 can perform error detection operations and/or error correction operations on data received from the host 104 or from the memory devices 116. An example of an error detection operation is a cyclic redundancy check (CRC) operation. CRC may be referred to as algebraic error detection. CRC can include the use of a check value resulting from an algebraic calculation using the data to be protected. CRC can detect accidental changes to data by comparing a check value stored in association with the data to the check value calculated based on the data. An example of an error correction operation is an error correction code (ECC) operation. ECC encoding refers to encoding data by adding redundant bits to the data. ECC decoding refers to examining the ECC encoded data to check for any errors in the data. In general, the ECC can not only detect the error but also can correct a subset of the errors it is able to detect.

The back end portion 112 can include a media controller and a physical (PHY) layer that couples the memory controller 106 to the memory devices 116. As used herein, the term "PHY layer" generally refers to the physical layer in the Open Systems Interconnection (OSI) model of a computing system. The PHY layer may be the first (e.g., lowest) layer of the OSI model and can be used transfer data over a physical data transmission medium. In some embodiments, the physical data transmission medium can include channels 118-1, ..., 118-N. The channels 118 can include a sixteen pin data bus and a two pin data mask inversion (DMI) bus, among other possible buses. The back end portion 112 can exchange (e.g., transmit or receive) data with the memory devices 116 via the data pins and exchange error detection information and/or error correction information with the memory devices 116 via the DMI pins. The error detection information and/or error correction information can be exchanged simultaneously with the exchange of data.

An example of the memory devices 116 is dynamic random access memory (DRAM) such as low-power double data rate (LPDDR) memory. In at least one embodiment, at least one of the memory devices 116 is operated as an LPDDR DRAM device with low-power features disabled. In some embodiments, although the memory devices 116 are LPDDR memory devices, the memory devices 116 do not include circuitry configured to provide low-power functionality for the memory devices 116 such as bank group, or other low-power functionality providing circuitry. Providing the LPDDR memory devices 116 without such circuitry can advantageously reduce the cost, size, and/or complexity of the LPDDR memory devices 116.

In some embodiments, the memory controller 106 can include a management unit 114 to initialize, configure, and/or monitor characteristics of the memory controller 106. The management unit 114 can include an I/O bus to manage out-of-band data and/or commands, a management unit controller to execute instructions associated with initializing, configuring, and/or monitoring the characteristics of the memory controller, and a management unit memory to store data associated with initializing, configuring, and/or monitoring the characteristics of the memory controller 106. As used herein, the term "out-of-band" generally refers to a transmission medium that is different from a primary transmission medium of a network. For example, out-of-band data and/or commands can be data and/or commands transferred to a network using a different transmission medium than the transmission medium used to transfer data within the network.

Figure 2:
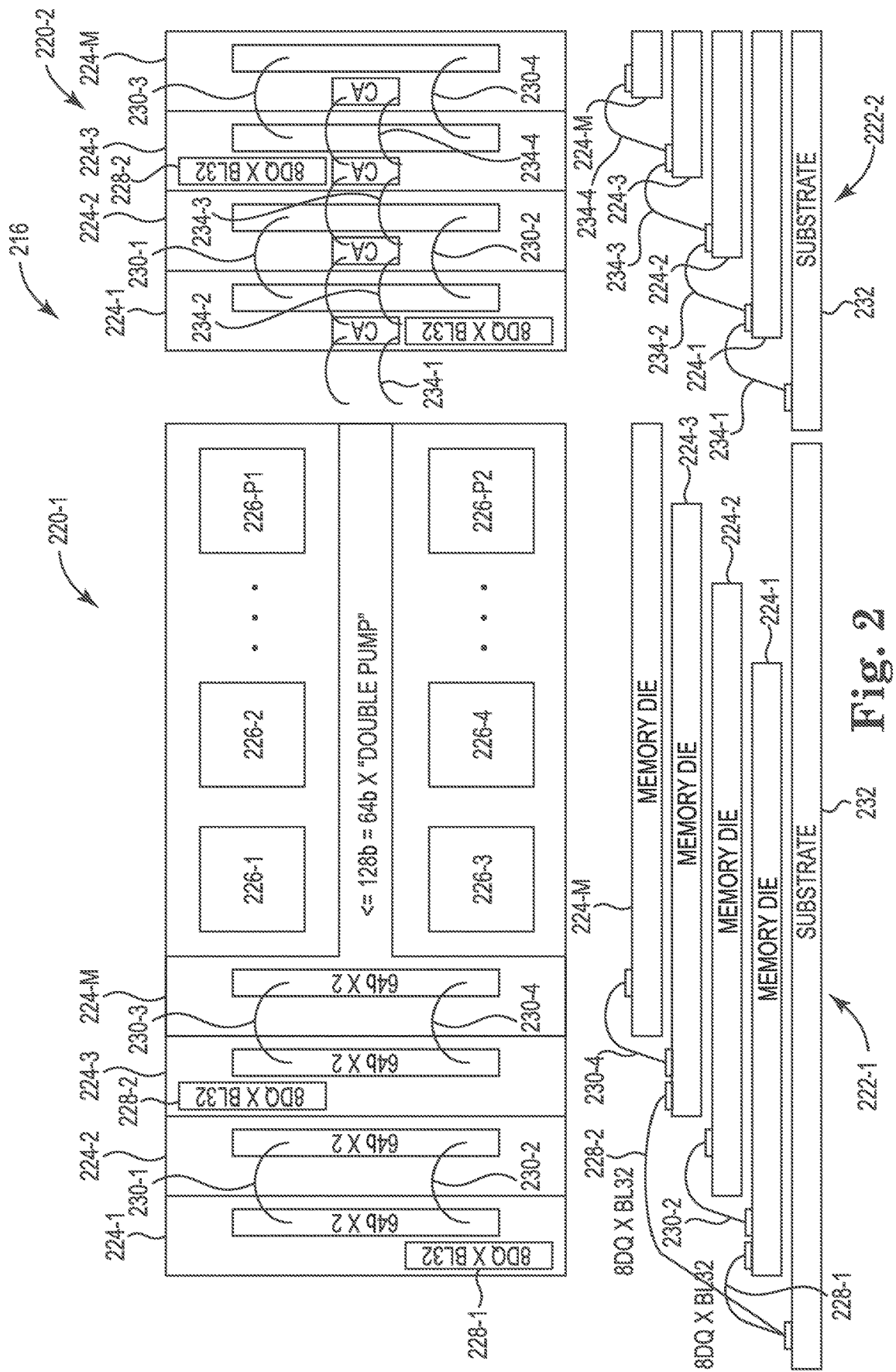
FIG. 2 is a block diagram of a memory device architecture in accordance with a number of embodiments of the present disclosure.

FIG. 2 is a block diagram of a memory device 216 architecture in accordance with a number of embodiments of the present disclosure. The block diagram includes a first partial top view 220-1 illustrating various connections for data transfer and a second partial top view 220-2 illustrating various connections for command/address (CA) signaling. The block diagram also includes a first partial side view 222-1 illustrating various connections for data transfer and a second partial side view 222-2 illustrating various connections for CA signaling.

The memory device 216 includes stacked memory dies 224-1, 224-2, 224-3, ..., 224-M formed on a substrate 232. Although four memory dies 224 are illustrated, embodiments are not so limited. Stacked memory dies 224 allow for increased memory capacity without significant expansion laterally by stacking the memory dies 224 vertically. In the first partial top view 220-1, the memory die 224-M is illustrated with various memory banks 226-1, 226-2, ..., 226-P1, and 226-3, 226-4, ..., 226-P2. Although not specifically illustrated, the memory dies 224-1, 224-2, 224-3 include memory banks 226 analogous to those illustrated for the memory die 224-M.

A memory bank 226 can include one or more memory arrays, such as a DRAM array, SRAM array, STT RAM array, PCRAM array, TRAM array, RRAM array, NAND flash array, NOR flash array, and/or 3D cross-point array for instance. The array can include memory cells arranged in rows coupled by access lines (which may be referred to herein as word lines or select lines) and columns coupled by sense lines (which may be referred to herein as digit lines or bit lines). Address signals are received and decoded by a row decoder and a column decoder to access the memory array. Data can be read from memory array by sensing voltage and/or current changes on the sense lines using sensing circuitry. The sensing circuitry is coupled to the memory array. The sensing circuitry can comprise, for example, sense amplifiers that can read and latch a page (e.g., row) of data from the memory array. IO circuitry 112 can be used for bi-directional data communication with the logic device 104 along a data path 108. Read/write circuitry is used to write data to the memory array 106 or read data from the memory array 106. The read/write circuitry can include various drivers, latch circuitry, etc.

Although not specifically illustrated, the substrate 232 can include control circuitry for the memory dies 224. Control circuitry can decode signals provided by a host. The signals can be commands provided by the host. These signals can include chip enable signals, write enable signals, and address latch signals that are used to control operations performed on the memory array, including data read operations, data write operations, and data erase operations. The control circuitry can be a state machine, a sequencer, and/or some other type of control circuitry, which may be implemented in the form of hardware, firmware, or software, or any combination of the three.

In contrast to some previous approaches, each memory die 224 is not coupled to the substrate 232 by an independent data input/output (also referred to in the art as a "DQ"). Instead, some memory dies 224 are coupled to the substrate 232 by an external data link 228 and some memory dies 224 are coupled to other memory dies 224 by an internal data link 230. As illustrated, the first memory die 224-1, which is on the substrate 232, includes a first external data link 228-1 to the substrate 232. The second memory die 224-2, which is on the first memory die 224-1, includes a first internal data link 230-1, 230-2 to the first memory die 224-1. The third memory die 224-3, which is on the second memory die 224-2, includes a second external data link 228-2 to the substrate 232. The fourth memory die 224-M, which is on the third memory die 224-3, includes a second internal data link 230-3, 230-4 to the third memory die 224-3. Each of the internal data links 230 can include one or more than one physical connection. As illustrated in FIG. 2, the first internal data link 230-1, 230-2 includes two physical connections and the second internal data link 230-3, 230-4 includes two physical connections (e.g., for communication of signals indicative of data). The second memory die 224-2 can be coupled to the first memory die 224-1 via a first pair of internal data links 230-1, 230-2 (e.g., each serving a respective portion of the memory banks of the second memory die 224-2). The fourth memory die 224-M can be coupled to the third memory die 224-3 via a second pair of internal data links 230-3, 230-4 (e.g., each serving a respective portion of the memory banks 226 of the fourth memory die 224-M).

The second memory die 224-2 is configured to communicate signals indicative of data via the first internal data link 230-1. The fourth memory die 224-M is configured to communicate signals indicative of data via the second internal data link 230-2. The first memory die 224-1 is configured to communicate signals indicative of data from the first memory die 224-1 and the signals indicative of data from the second memory die 224-2 via the first external data link 228-1. The third memory die 224-3 is configured to communicate signals indicative of data from the third memory die 224-3 and the signals indicative of data from the fourth memory die 224-M via the second external data link 228-2. In some embodiments, each of the transfers can be controlled by control circuitry on the substrate 232. In at least one embodiment, the first external data link 228-1 and the second external data link 228-2 are operated as a single channel.

CA signals can be exchanged with the memory dies 224 from the substrate 232 by a cascaded wire bonding. As illustrated, the first memory die 224-1 is coupled to the substrate 232 by a first CA link 234-1. The second memory die 224-2 is coupled to the first memory die 224-1 by a second CA link 234-2. The third memory die 224-3 is coupled to the second memory die 224-2 by a third CA link 234-3. The fourth memory die 224-M is coupled to the third memory die 224-3 by a fourth CA link 234-4. Although not specifically illustrated, the substrate 232 can include control circuitry configured to provide CA signals to the first memory die 224-1 via the first CA link 234-1. The control circuitry can be configured to provide CA signals to the second memory die 224-2 via the first CA link 234-1 and the second CA link 234-2. The control circuitry can be configured to provide CA signals to the third memory die 224-3 via the first CA link 234-1, the second CA link 234-2, and the third CA link 234-3. The control circuitry can be configured to provide CA signals to the fourth memory die 224-M via the first CA link 234-1, the second CA link 234-2, the third CA link 234-3, and the fourth CA link 234-4. The CA links 234 can also provide power and ground connections for the memory dies 224. In some embodiments, on die termination is provided in parallel for each pair of memory dies 224. Each of the CA links 234 can include one or more than one physical connection. As illustrated in FIG. 2, each the CA links 234 include two physical connections (not separately labeled with reference numerals), however embodiments are not so limited. The pairs of physical connections for each CA link 234 can be used for separate CA signaling for embodiments operated with more than one rank per channel.

The external data links 228 can each be made up of a respective quantity of data lines (DQs), which may also be referred to as pins or pads. For example, each external data link 228 can include 8 DQs. The DQs can be operated with a burst length (e.g., a 32 bit burst length "BL"). A burst is a series of data transfers over multiple cycles.

In the example illustrated in FIG. 2 "8DQ×32BL" means that the 8 DQs are operated with a burst length of 32 bits for each external data link 228, for a total output of 256 bits per external data link 228. The 256 bits per external data link 228 per burst can be made up of 128 bits from each of two memory dies 224. With two external data links 228-1, 228-2, the memory device 216 can transfer signals indicative of 512 bits of data per rank per channel during the burst length (e.g., for read or write operations). The 128 bits per memory die 224 can be made up of two pumps of 64 bits each (128 bits=64 bits x double pump). In some embodiments, the total burst length can be divided into two or four portions (e.g., the 32 bit burst length can be divided into two 16 bits burst lengths or four 8 bit burst lengths). The total 32 bit burst length also represents two bursts of burst length 16 bits from each memory die 224.

In some approaches, when a total burst length is split between different memory dies, one or more clock cycles are included as "bubbles" between the data transfers associated with each portion of the burst. For example, the bubble can be used to allow time for rank-to-rank signal switching and/or internal memory die configuration. Specifically, the bubble can allow for a faster read/write clock to be synchronized with a slower CA clock. However, various embodiments of the present disclosure do not include such a clock bubble between different portions of the burst length, thereby reducing latency. Additional detail regarding timing is described below with respect to FIG. 4 and FIG. 6.

In one example, the first memory die 224-1 is configured to communicate via the first external data link 228-1 a first signal indicative of data from the first memory die 224-1 during a first portion of the burst length (e.g., a first 16 bit burst length) and a second signal indicative of data from the second memory die 224-2 during a second portion of the burst length (e.g., a second 16 bit burst length). During the first portion of the burst length, the data from the second memory die 224-2 can be prefetched (e.g., transferred from the second memory die 224-2 to the first memory die 224-1 via the first internal data link 230-1, 230-2). Analogously and contemporaneously, the third memory die 224-3 is configured to communicate via the second external data link 228-2 a third signal indicative of data from the third memory die 224-3 during the first portion of the burst length (e.g., a first 16 bit burst length) and a fourth signal indicative of data from the fourth memory die 224-M during the second portion of the burst length (e.g., a second 16 bit burst length). During the first portion of the burst length, the data from the fourth memory die 224-M can be prefetched (e.g., transferred from the fourth memory die 224-M to the third memory die 224-3 via the first internal data link 230-1, 230-2).

In one example, the first memory die 224-1 is configured to communicate via the first external data link 228-1 a first signal indicative of data from the first memory die 224-1 during a first portion of the burst length (e.g., a first 8 bit burst length), a second signal indicative of data from the second memory die 224-2 during a second portion of the burst length (e.g., a second 8 bit burst length), a third signal indicative of data from the first memory die 224-1 during a third portion of the burst length (e.g., a third 8 bit burst length), and a fourth signal indicative of data from the second memory die 224-2 during a fourth portion of the burst length (e.g., a fourth 8 bit burst length). During the first and third portions of the burst length, the data from the second memory die 224-2 can be prefetched (e.g., transferred from the second memory die 224-2 to the first memory die 224-1 via the first internal data link 230-1, 230-2). Analogously and contemporaneously, the third memory die 224-3 is configured to communicate via the second external data link 228-2 a fifth signal indicative of data from the third memory die 224-3 during the first portion of the burst length ("1$^{st}$ BL8"), a sixth signal indicative of data from the fourth memory die 224-M during the second portion of the burst length, a seventh signal indicative of data from the third memory die 224-3 during the third portion of the burst length, and an eighth signal indicative of data from the fourth memory die 224-M during the fourth portion of the burst length. During the first and third portions of the burst length, the data from the fourth memory die 224-M can be prefetched (e.g., transferred from the fourth memory die 224-M to the third memory die 224-3 via the first internal data link 230-1, 230-2).

Although not specifically illustrated in FIG. 2, the timing of the DQs can be controlled with a first clock and the timing of at least one of the CA links 234 can be controlled with a second clock. In at least one embodiment, the first clock can operate at a higher frequency than the second clock. For example, the first clock can operate four times faster than the second clock such that reads or writes of data can occur with one transfer (signal indicative of data) per cycle of the first clock and one transfer (CA signals) per cycle of the second clock. In this example, the CA signal can be a quadruple load and the signal indicative of data can be a single load.

At least one embodiment of the present disclosure provides advantages over LPDDR memory device operation, while maintaining compliance with an LPDDR standard. For example, a relatively lesser quantity of memory ranks can improve read/write operation (e.g., read-to-read command timing). A clock bubble between portions of a total burst length may not be used, thereby improving latency. Column address to column address delay requirements (tCCD) can be relaxed. Lower prefetch sizes per die can be used. In some embodiments, various features of LPDDR are not used, such as bank groups (thereby reducing timing constraints and metal resources and/or costs), dynamic operations such as on the fly (OTF) switching between burst modes without a command, burst ordering, etc.

Figure 3:
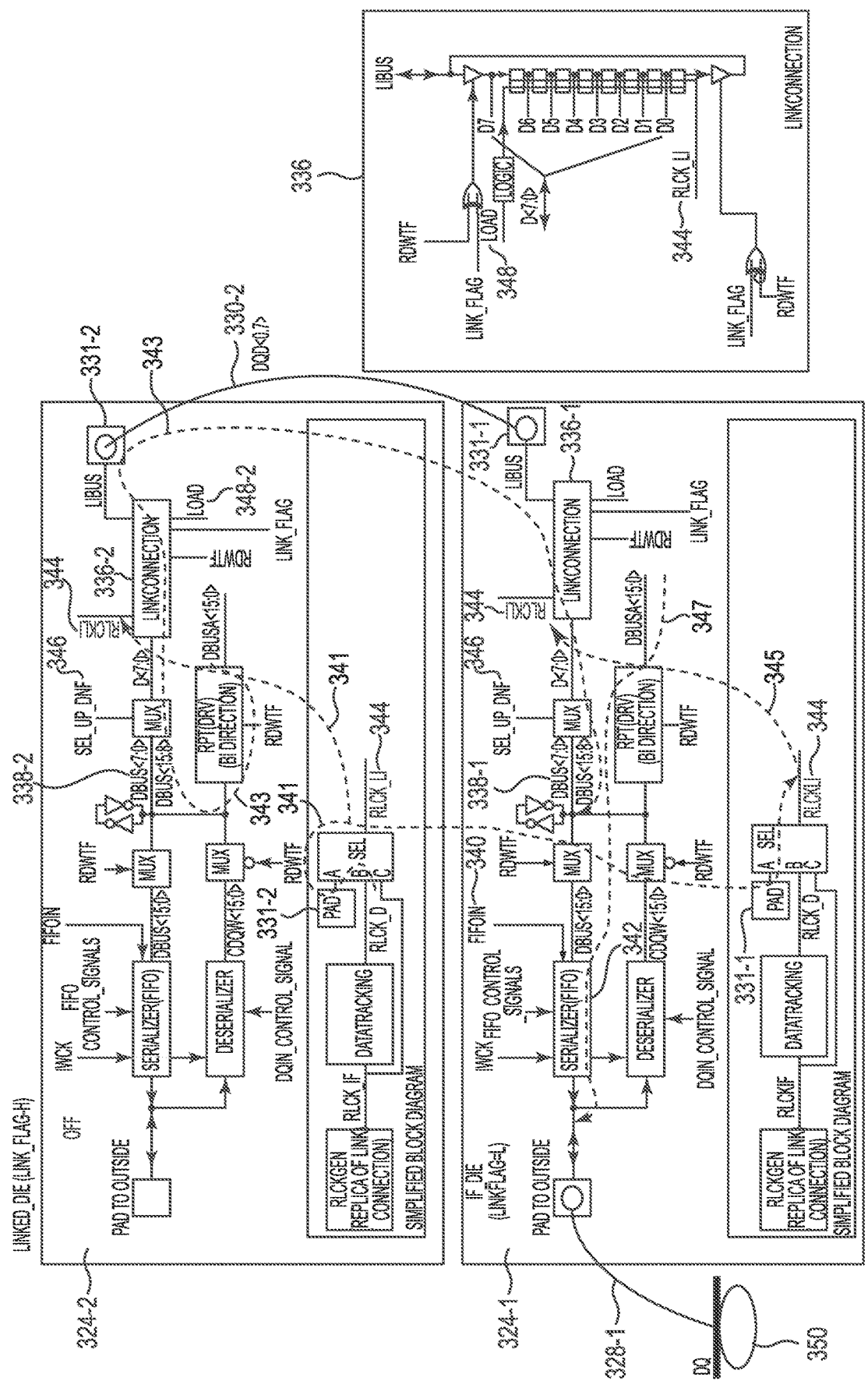
FIG. 3 is a block diagram of a link architecture between memory dies illustrating a read operation in accordance with a number of embodiments of the present disclosure.

FIG. 3 is a block diagram of a link architecture between memory dies 324-1, 324-2 illustrating a read operation in accordance with a number of embodiments of the present disclosure. The first memory die 324-1 is analogous to the first memory die 224-1 and/or the third memory die 224-3 illustrated in FIG. 2. The second memory die 324-2 is analogous to the second memory die 224-2 and/or the fourth memory die 224-4 illustrated in FIG. 2. For ease of explanation, reference will generally be made to the first and second memory dies. Furthermore, the first and third memory dies are occasionally referenced as interface dies while the second and fourth memory dies are occasionally referenced as linked dies with respect to FIGS. 3-6.

The first memory die 324-1 is coupled via an external data link 328-1 to a DQ 350 (e.g., to the substrate 232 illustrated in FIG. 2). The memory dies 324 can be fabricated identically and then later connected externally (e.g., to a substrate, interposer, host, etc.) and/or internally with other memory dies 324. For example, the internal components of the memory dies 324 can be identical (e.g., the second memory die 324-2 includes a "pad to outside" even though it is not connected). As illustrated, for the second memory die 324-2, which does not have an external data link, the "pad to outside", serializer FIFO, deserializer, and the pair of multiplexors can all be powered down as indicated by "OFF" in the second memory die 324-2 in FIG. 3. The corresponding components of the first memory die 324-1 can be powered up. Such embodiments can improve fabrication efficiency.

In FIG. 3, the bottom box "simplified block diagram" illustrated in each memory die 324 presents a simplified view of the signaling and logic to operate the memory die 324. For example, the blocks labeled "PAD" 331-1, 331-2 in the simplified block diagram are indicative of the blocks connected to the internal data link bus "LIBUS" as indicated at 331-1, 331-2 in the top right corner of each memory die 324. The second memory die 324-2 is coupled to the first memory die 324-1 via an internal data link 330-2, which can also be referred to as an internal DQ "DQD <0:7>". The pads 331 are connected to the internal data link 330-2 between the memory dies 324.

The pads 331 are connected to link connection circuitry 336-1, 336-2 via respective link buses. A more detailed illustration of the link connections 336 is illustrated in the block on the right side of FIG. 3. Inputs to the link connection circuitry 336 include the signals RDWTF, LINK_FLAG, LOAD 348, RLCKLI 344. The link connection circuitry 336-1 in the second memory die 324-2 is illustrated having the signal LOAD 348-2, which corresponds to the LOAD(LINKED DIE) signal 448-2 illustrated in FIG. 4. The link connection circuitry 336 also includes data input/output labeled as "D<7:0>", representing an 8 bit wide data bus, and the input/output to the LIBUS. The D<7:0> bus from the link connection 336 circuitry is connected to a multiplexor controlled by a signal SEL_UP_DNF 346.

The link connection circuitry 336 can operate according to the following truth table:

TABLE 1

| Case | Link Flag | RDWTF | Load |
|------|-----------|-------|------|
| 1 | Low | High | Low |
| 2 | High | High | High |
| 3 | Low | Low | High |
| 4 | High | Low | Low |

The RDWTF signal effectively indicates whether a read or write operation is being performed. Case 1 and case 2 can be used as part of a read operation. Case 3 and case 4 can be used as part of a write operation and are described in more detail with respect to FIGS. 5-6. In case 2, the signal RLCK D is transferred to the pad 331 according to the signal RLCKLI 344 as indicated in FIG. 3 by the dotted lines 341. Case 2 can be applied to the second memory die 324-2 to transfer a signal indicative of data from the second memory die 324-2 via the internal data link 330-2 to the first memory die 324-1 as indicated in FIG. 3 by the dotted line 343. The dotted line 343 also indicates the path of data from the memory array of the second memory die 324-2, through the link connection circuitry 336-2, through the pad 331-2, through the internal data link 330-2, through the pad 331-1, through the link connection 336-1 to the serializer 342-1. While the signals indicative of data from the second memory die 324-2 are being transferred via the internal data link 330-2 to the first memory die 324-1, data from the first memory die 324-1 can be transferred to the external data link 328-1 as indicated by the dotted line 347.

In case 1, a signal is received from the pad 331 according to the signal RLCKLI signal 344 as indicated in FIG. 3 by the dotted line 345. Case 1 can be applied to the second memory die 324-2 to receive the signal sent according to case 1 from the second memory die 324-2 via the internal data link 330-2 and the pad 331-2 by the first memory die 324-1.

As part of the read operation, signals indicative of the data from the first memory die 324-1 reach the first in first out (FIFO) serializer 342 followed by signals indicative of the data from the second memory die 324-2. The signals indicative of data are transferred from the FIFO 342 to the "PAD TO OUTSIDE" and transfer to the DQ 350 via the external data link 328-1.

Figure 4:
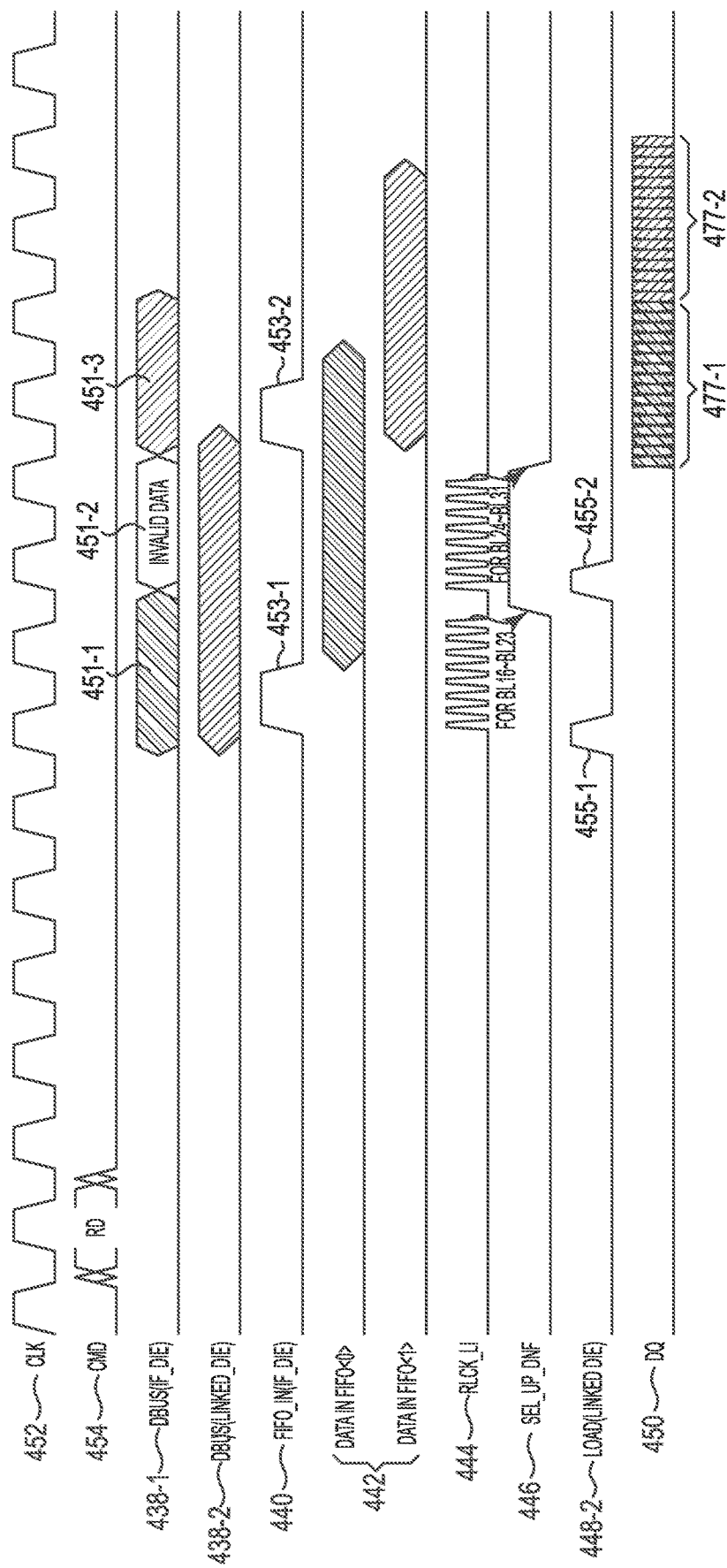
FIG. 4 is a timing diagram for a read operation in accordance with a number of embodiments of the present disclosure.

FIG. 4 is a timing diagram for a read operation in accordance with a number of embodiments of the present disclosure. The timing diagram corresponds to the read operation illustrated with respect to the diagram of the link architecture between memory dies illustrated in FIG. 3. In FIG. 4, the clock signal 452 represents a system clock such as a CA clock. A read command can be issued as indicated by "RD" in the command signal 454. The read clock 444 can operate at a greater frequency than the CA clock as indicated in the read clock signal RLCK LI 444.

The load signal 448-2 corresponds to the signal 348-2 associated with the link connection 336-2 of the second memory die 324-2 in FIG. 3. The load signal 448-2 on the second memory die can go high when both the link flag signal and the RDWTF signal match, as described above with respect to FIG. 3. As illustrated in FIG. 4, two loads are triggered according to the load signal 448-2. The first trigger 455-1 on the load signal 448-2 corresponds to the start of the first burst on the read clock 444. The start of the second trigger 455-2 on the load signal 448-2 corresponds to the start of the second burst on the read clock 444. The end of the first burst on the read clock 444 corresponds to the signal SEL_UP_DNF 446 going high and the end of the second burst on the read clock 444 corresponds to the signal SEL_UP_DNF 446 going low. With respect to FIG. 3, the signal SEL_UP_DNF 346 is applied to a multiplexor in the first memory die 324-1 to control multiplexing of different bursts.

The first trigger 455-1 on the load signal 448-2 also corresponds to a first trigger on the signal FIFO_IN 440 of the first memory die. Contemporaneously, signals indicative of data begin to transfer on the data buses ("DBUS") of the first die as indicated by the first eye 451-1 on the DBUS (IF_DIE) 438-1 and of the second die as indicated by the eye on the DBUS(LINKED_DIE) 438-2. With respect to FIG. 3, this corresponds to signals indicative of data being transferred on the data bus 338-1 of the first memory die 324-1 (indicated by a portion of the dotted line 347) and on the data bus 338-2 of the second memory die 324-2 (indicated by a portion of the dotted line 343). As described above, signals indicative of the data from the second memory die are transferred to the first memory die and make their way to the data bus of the first memory die. This is indicated in FIG. 4 by the third eye 451-3 on the data bus 438-1. The second eye 451-2 on the data bus 438-1 represents invalid data that is not transferred to the FIFO because the signal FIFI_IN (IF_DIE) 440 is only triggered in conjunction with the first eye 451-1 and the third eye 451-3.

The signal FIFO_IN 440 is applied to the serializer FIFO 342 of the first memory die 324-1 illustrated in FIG. 3. The end of the first trigger 453-1 on the signal FIFO_IN 440 corresponds to a opening of the eye on the DATA IN FIFO<0> 442, which represents signals indicative of data from the first memory die being present in the FIFO. The start of the second trigger 453-2 on the signal FIFO_IN 440 corresponds to the opening of the eye on the DATA IN FIFO<1> 442, which represents signals indicative of data from the second memory die being present in the FIFO. The end of the second trigger 453-2 on the signal FIFO_IN 440 corresponds to the closing of the eye on the DATA IN FIFO<0> 442. Although illustrated on separate lines for clarity, the DATA IN FIFO<0> and DATA IN FIFO<1> can both correspond to the FIFO 342 of the first memory die 324-1 in FIG. 3.

The DQ line 450 illustrates signals indicative of data being transferred via the external data link 328-1 to the DQ 350 as illustrated in FIG. 3. The DQ line 450 illustrates first signals 477-1 indicative of data originating from the first memory die and second signals 477-2 indicative of data originating from the second memory die.

Figure 5:
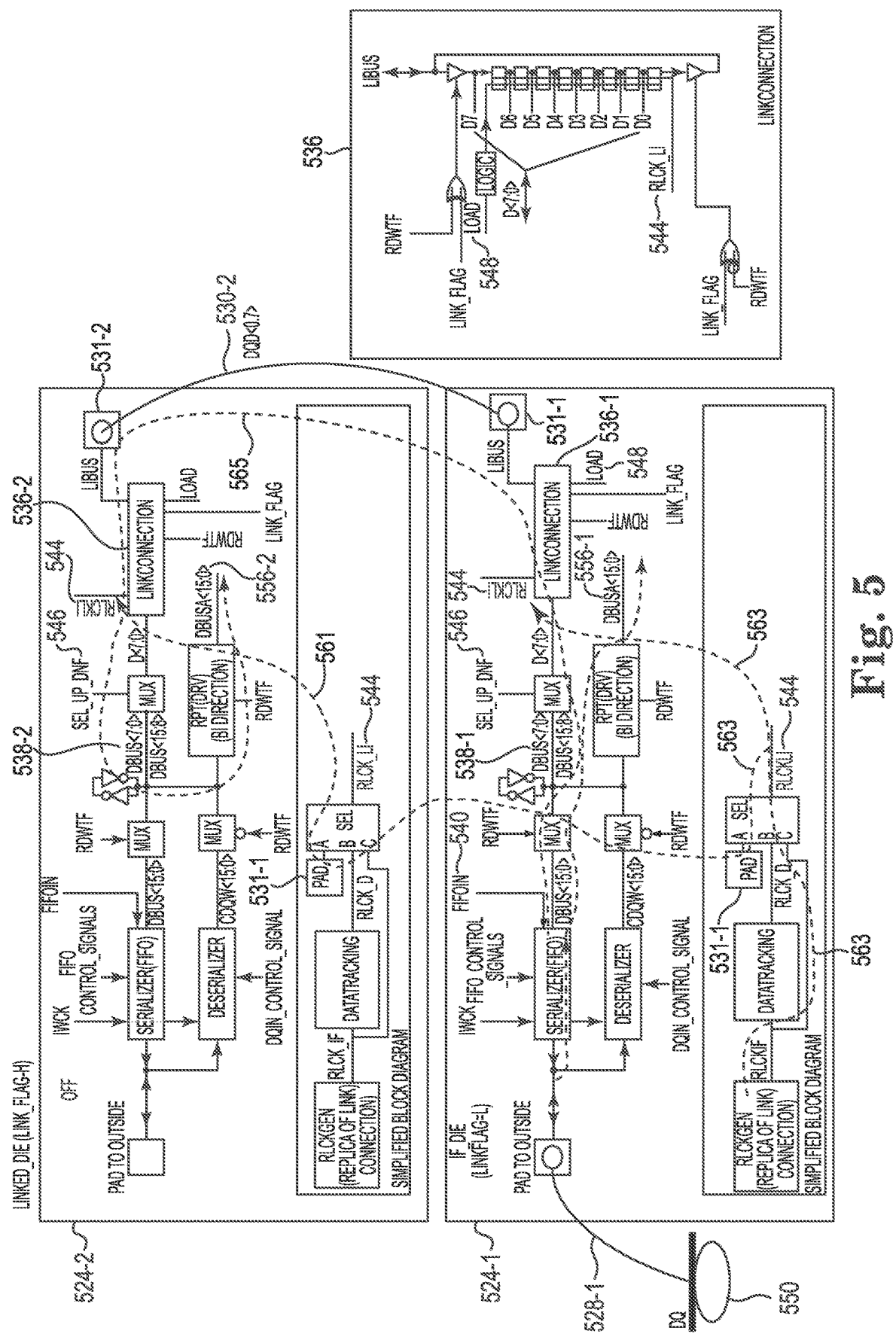
FIG. 5 is a block diagram of a link architecture between memory dies illustrating a write operation in accordance with a number of embodiments of the present disclosure.

FIG. 5 is a block diagram of a link architecture between memory dies illustrating a write operation in accordance with a number of embodiments of the present disclosure. The first memory die 524-1 is coupled via an external data link 528-1 to a DQ 550 (e.g., to the substrate 232 illustrated in FIG. 2). As illustrated, for the second memory die 524-2, which does not have an external data link, the "pad to outside", serializer FIFO, deserializer, and the pair of multiplexors can all be powered down as indicated by "OFF" in the second memory die 524-2 in FIG. 5. The corresponding components of the first memory die 524-1 can be powered up.

The pads 531-1, 531-2 are connected to link connection circuitry 536-1, 536-2 via respective link buses. Inputs to the link connection circuitry 536 include the signals RDWTF, LINK_FLAG, LOAD 548, RLCKLI 544. The link connection circuitry 536-1 in the first memory die 524-1 is illustrated having the signal LOAD 548-1, which corresponds to the signal LOAD(LINKED DIE) 648-1 illustrated in FIG. 6. The link connection circuitry 536 also includes data input/output labeled as "D<7:0>", representing an 8 bit wide data bus, and the input/output to the LIBUS. The D<7:0> bus from the link connection 536 circuitry is connected to a multiplexor controlled by a signal SEL_UP_DNF 546.

The link connection circuitry 536 can operate according to Table 1. With reference to Table 1 above, case 3 and case 4 can be used as part of a write operation. In case 3, the signal RLCKIF (indicative of data being sent to the interface die) is transferred to the pad 531 according to the signal RLCKLI 544 as indicated in FIG. 5 by the dotted line 563. In case 4, a signal is transferred to the pad 531-2 according to the signal RCLKLI 544 as illustrated by the dotted line 561. Case 4 can be applied to the second memory die 524-2 to write data to the second memory die 524-2 from the first memory die 524-1. The dotted line 565 indicates the path of data from the serializer and/or deserializer of the first memory die 524-1, through the data bus 538-1, the link connection 536-1, the pad 531-1, the internal data link 530-2, the pad 531-2, the link connection 536-2, the data bus 538-2, and to the memory array of the second memory die 524-2 via the DBUSA<15:0> 556-2. The dotted line 567 indicates the path of data from the serializer or deserializer of the first memory die 524-1, through the data bus 538-1, and to the memory array of the first memory die 524-1 via the DBUSA<15:0> 556-1.

As part of the write operation, signals indicative of the data to be written to the first memory die 524-1 can be received from the DQ 550 and the external data link 528-1 to the serializer and/or deserializer of the first memory die 524-1 followed by signals indicative of data to be written to the second memory die 524-2. The signals intended for the first memory die 524-1 can be written thereto via the data buses 538-1 and 556-1 of the first memory die 524-1. The signals intended for the second memory die 524-2 can be passed thereto via the data bus 538-1, link connection 536-1, internal data link 530-2, link connection 536-2, and data buses 538-2, 556-2. Although not specifically illustrated, in some embodiments signals indicative of data intended for the second memory die 524-2 can be received from the DQ 550 prior to signals indicative of data intended for the first memory die 524-1. In such embodiments, the signals indicative of data for the second memory die 524-2 can be passed thereto while the signals indicative of data for the first memory die 524-1 are being received.

Figure 6:
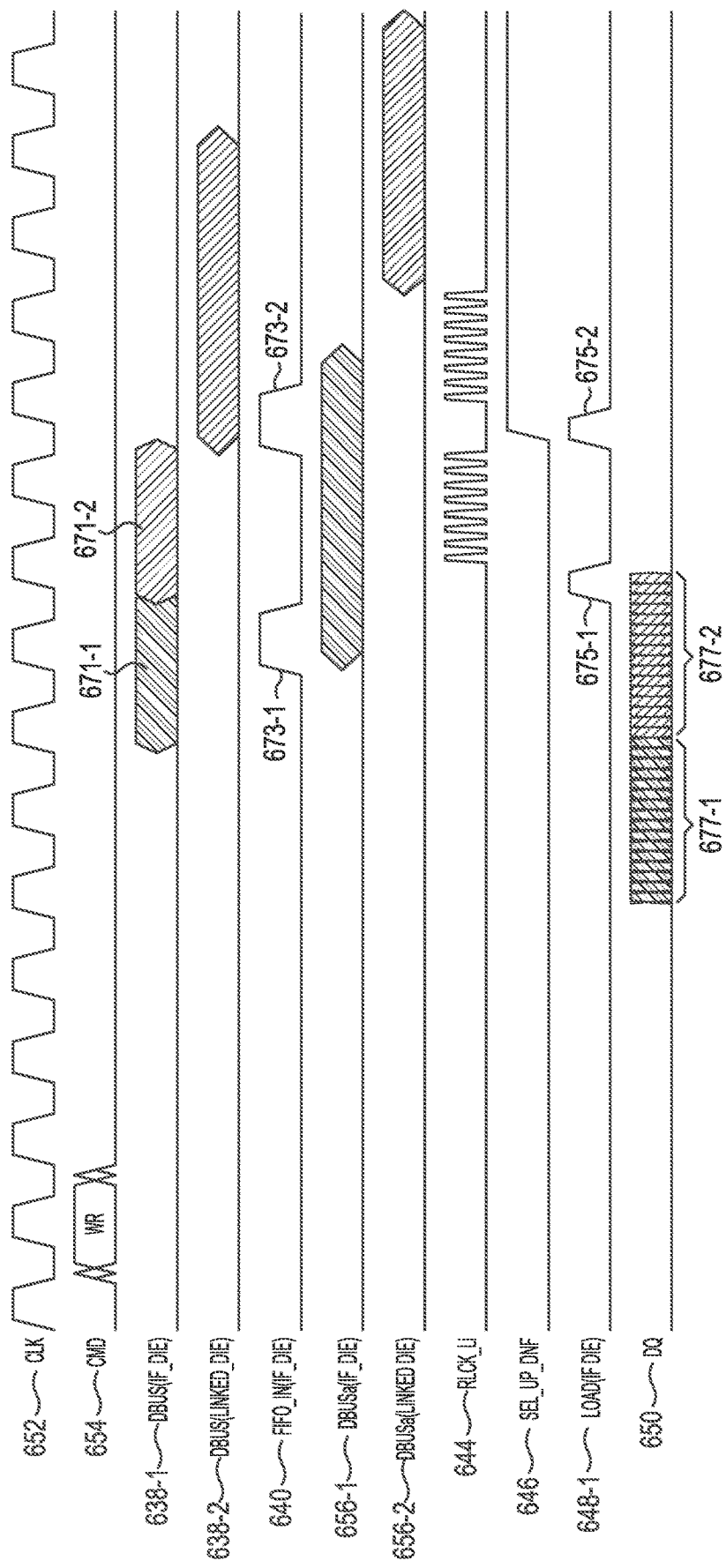
FIG. 6 is a timing diagram for a write operation in accordance with a number of embodiments of the present disclosure.

FIG. 6 is a timing diagram for a write operation in accordance with a number of embodiments of the present disclosure. The timing diagram corresponds to the read operation illustrated with respect to the diagram of the link architecture between memory dies illustrated in FIG. 5. In FIG. 6, the clock signal 652 represents a system clock such as a CA clock. A write command can be issued as indicated by "WR" in the command signal 654. The read clock 644 can operate at a greater frequency than the CA clock as indicated in the read clock signal RLCK LI 644. The read clock 644 may also be referred to as a write clock and/or a read/write clock.

The DQ line 650 illustrates signals indicative of data being received from the DQ 550 via the external data link 528-1 as illustrated in FIG. 5. The DQ line 650 illustrates first signals 677-1 indicative of data intended for the first memory die and second signals 657-2 indicative of data intended for the second memory die.

The signals indicative of data intended for the first memory die begin to transfer on the data bus ("DBUS") of the first die as indicated by the first eye 671-1 on the DBUS(IF_DIE) 638-1. The signals indicative of data intended for the second memory die follow on the data bus of the first die as indicated by the second eye 671-2 on the DBUS(IF_DIE) 638-1.

The signal FIFO_IN(IF_DIE) 640 is applied to the serializer FIFO of the first memory die. The beginning of the first trigger 673-1 on the FIFO_IN signal 640 corresponds to a opening of the eye on the DBUSa(IF_DIE) 656-1, which represents signals indicative of data for the first memory die being present in the data bus 556-1 illustrated in FIG. 5 (prior to being written to memory, as indicated by a portion of the dotted line 567). The end of the first trigger 673-1 on the FIFO_IN signal 640 corresponds to the data on the DBUS(IF_DIE) 638-1 changing from data intended for the first memory die to data intended for the second memory die.

The end of the first trigger 673-1 on the signal FIFO_IN 640 also corresponds to the start of the first trigger 675-1 on the signal LOAD(IF_DIE) 648-1. The signal LOAD(IF-_DIE) 648-1 corresponds to the signal LOAD 548-1 associated with the link connection 336-1 of the first memory die 524-1 in FIG. 5. The end of the first trigger 675-1 on the signal LOAD(IF_DIE) 648-1 corresponds to the start of the first burst on the read clock 644. The load signal 648-1 on the first memory die can go high when both the link flag signal and the RDWTF signal match, as described above.

The start of the second trigger 673-2 on the signal FIFO_IN 640 corresponds to the opening of the eye on the DBUS(LINKED_DIE) 638-2, which represents signals indicative of data for the second memory die being present in the data bus 538-2 illustrated in FIG. 5. The start of the second trigger 673-2 on the signal FIFO_IN 640 also corresponds to the closing of the second eye 671-2 on the DBUS(IF_DIE) 638-1, indicating that all of the data has been passed through the data bus 538-1 of the first memory die 524-1 illustrated in FIG. 5. The start of the second trigger 673-2 on the signal FIFO_IN 640 also corresponds to the end of the first burst on the read clock 644.

The end of the first burst on the read clock 644 corresponds to the signal SEL_UP_DNF 646 going high, which also corresponds to the second trigger 675-2 on the signal LOAD(IF_DIE) 648-1. With respect to FIG. 5, the signal SEL_UP_DNF 546 is applied to a multiplexor in the first memory die 524-1 to control multiplexing of different bursts. The end of the second trigger 675-2 on the signal LOAD(IF_DIE) 648-1 corresponds to the start of the second burst on the read clock 644. The end of the second burst on the read clock 644 corresponds to the opening of the eye on the DBUSa(LINKED_DIE) 656-2, which represents signals indicative of data for the second memory die being present in the data bus 556-2 illustrated in FIG. 5 (prior to being written to memory, as indicated by a portion of the dotted line 565).

Figure 7:
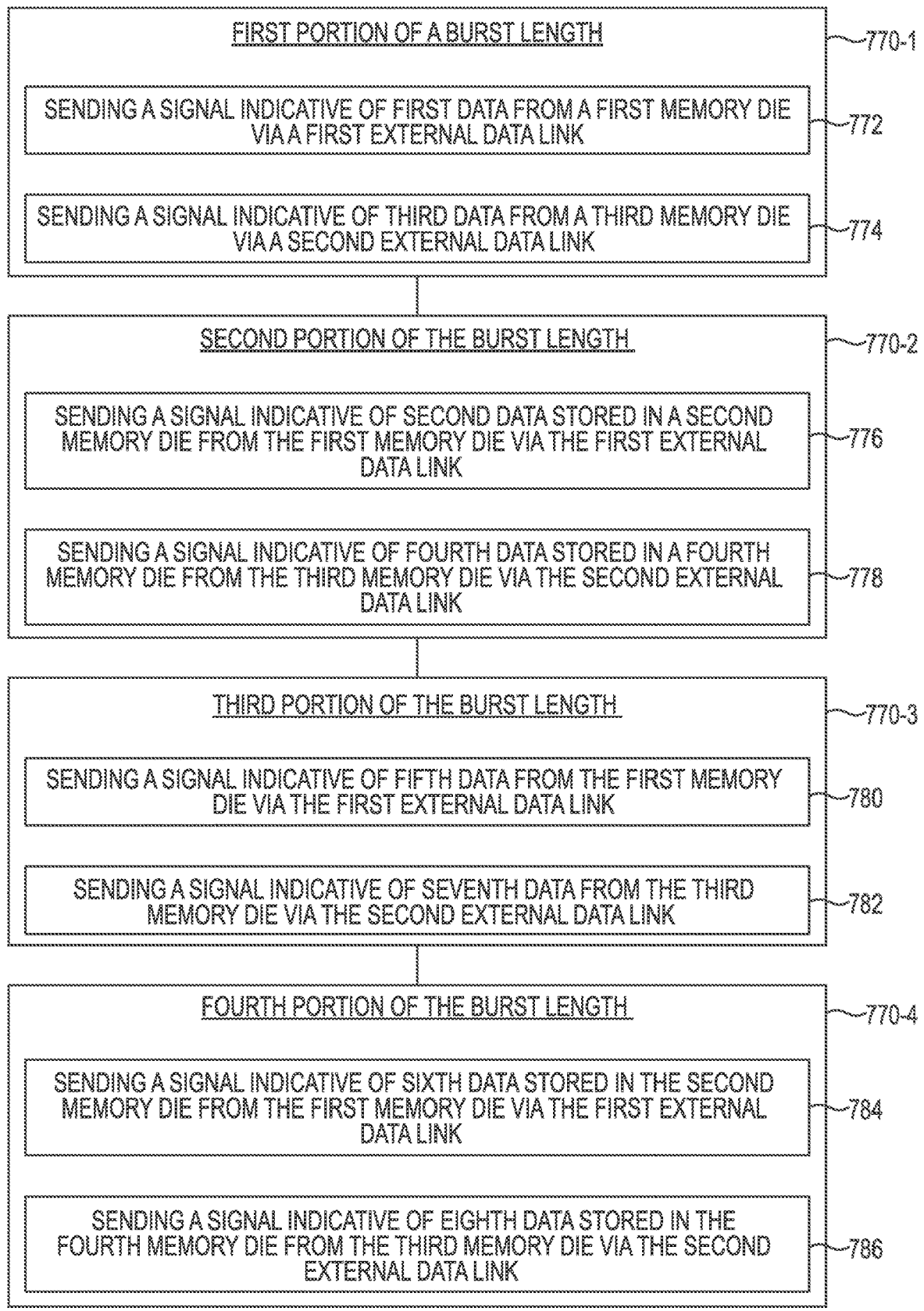
FIG. 7 is a flow diagram of a method for exchanging data with multiple memory dies of a memory device in accordance with a number of embodiments of the present disclosure.

FIG. 7 is a flow diagram of a method for exchanging data with multiple memory dies of a memory device in accordance with a number of embodiments of the present disclosure. The method can be performed by hardware (e.g., a processing device, circuitry, dedicated logic, programmable logic, microcode, hardware of a device, integrated circuit, etc.). Although shown in a particular sequence or order, unless otherwise specified, the order of the processes can be modified. Thus, the illustrated embodiments should be understood only as examples, and the illustrated processes can be performed in a different order, and some processes can be performed in parallel.

The method can occur over four portions 770-1, 770-2, 770-3, 770-4 of a burst length. During a first portion 770-1 of the burst length, as illustrated at 772, the method can include sending a signal indicative of first data from a first memory die (e.g., memory die 224-1 in FIG. 2) via a first external data link (e.g., external data link 228-1). During the first portion 770-1 of the burst length, the method can include, as illustrated at 774, sending a signal indicative of third data from a third memory die (e.g., memory die 228-3) via a second external data link (e.g., external data link 228-2).

During a second portion 770-2 of the burst length, the method can include, as illustrated at 776, sending a signal indicative of second data stored in a second memory die (e.g., memory die 224-2) from the first memory die via the second external data link. During the second portion 770-2 of the burst length, the method can include, as illustrated at 778, sending a signal indicative of fourth data stored in a fourth memory die (e.g., memory die 224-4) from the third memory die via the second external data link.

During a third portion 770-3 of the burst length, the method can include, as illustrated at 780, sending a signal indicative of fifth data from the first memory die via the first external data link. During the third portion 770-3 of the burst length, the method can include, as illustrated at 782, sending a signal indicative of seventh data from the third memory die via the second external data link.

During a fourth portion 770-4 of the burst length, the method can include, as illustrated at 784, sending a signal indicative of sixth data stored in the second memory die from the first memory die via the first external data link and, as illustrated at 786, sending a signal indicative of eighth data stored in the fourth memory die from the third memory die via the second external data link. In some embodiments, the method can include sending the signals indicative of the first, second, third, fourth, fifth, sixth, seventh, and eighth data without including a timing bubble between the first, the second, the third, or the fourth portions of burst.

Although not specifically illustrated, during the first portion 770-1 of the burst length, the method can include sending a signal indicative of the second data from the second memory die to the first memory die via a first internal data link (e.g., internal data link 230-2) and sending a signal indicative of the fourth data from the fourth memory die to the third memory die via a second internal data link (e.g., internal data link 230-4). Although not specifically illustrated, during the third portion 770-3, of the burst length, the method can include sending a signal indicative of the sixth data from the second memory die to the first memory die via the first internal data link and sending a signal indicative of the eighth data from the fourth memory die to the third memory die via the second internal data link.

The method can include receiving power at the first memory die via a CA link. The method can include receiving power from the first memory die at the second memory die via a second CA link, receiving power from the second memory die at the third memory die via a third CA link, and receiving power from the third memory die at the fourth memory die via a fourth CA link.

The method can include receiving a first CA signal at the first memory die via the CA link. The method can include receiving a second CA signal at the second memory die via the CA link and the second CA link, receiving a third CA signal at the third memory die via the CA link, the second CA link, and the third CA link, and receiving a fourth CA signal at the fourth memory die via the CA link, the second CA link, the third CA link, and the fourth CA link.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a substrate;
   a first memory die on the substrate and coupled to the substrate via a first external data link;
   a second memory die on the first memory die, the second memory die coupled to the first memory die via a first internal data link and configured to communicate signals indicative of data via the first internal data link;
   a third memory die on the second memory die and coupled to the substrate via a second external data link; and
   a fourth memory die on the third memory die, the fourth memory die coupled to the third memory die via a second internal data link and configured to communicate signals indicative of data via the second internal data link;
   wherein the first memory die is configured to communicate via the first external data link:
      signals indicative of data from the first memory die and the signals indicative of data from the second memory die via the first external data link;
      a first signal indicative of data from the first memory die during a first portion of a burst length;
      a second signal indicative of data from the second memory die during a second portion of the burst length;
      a third signal indicative of data from the first memory die during a third portion of the burst length; and
      a fourth signal indicative of data from the second memory die during a fourth portion of the burst length; and
   wherein the third memory die is configured to communicate signals indicative of data from the third memory die and the signals indicative of data from the fourth memory die via the second external data link.

2. The apparatus of claim 1, wherein the substrate further comprises control circuitry configured to control data transfers with the first, second, third, and fourth memory dies via the first and the third memory dies as a single channel.

3. The apparatus of claim 1, wherein the third memory die is configured to communicate via the second external data link:
a fifth signal indicative of data from the third memory die during the first portion of the burst length;
a sixth signal indicative of data from the fourth memory die during the second portion of the burst length;
a seventh signal indicative of data from the third memory die during the third portion of the burst length; and
an eighth signal indicative of data from the fourth memory die during the fourth portion of the burst length.

4. The apparatus of claim 1, wherein:
the first memory die is coupled to the substrate via a first command/address (CA) link;
the second memory die is coupled to the first memory die via a second CA link;
the third memory die is coupled to the second memory die via a third CA link;
the fourth memory die is coupled to the third memory die via a fourth CA link.

5. The apparatus of claim 4, wherein the substrate further comprises control circuitry configured to provide CA signals to:
the first memory die via the first CA link;
the second memory die via the first and the second CA links;
the third memory die via the first, the second, and the third CA links; and
the fourth memory die via the first, the second, the third, and the fourth CA links.

6. The apparatus of claim 4, wherein the first, the second, the third, and the fourth CA links further comprise power and ground connections for the first, the second, the third, and the fourth memory dies.

7. The apparatus of claim 4, wherein the first external data link comprises a first plurality of data lines and the second external data link comprises a second plurality of data lines; and
the apparatus further comprising:
a first clock configured to control timing of the first and the second pluralities of data lines; and
a second clock configured to control timing of at least the first CA link.

8. The apparatus of claim 1, wherein:
the second memory die is coupled to the first memory die via a first pair of internal data links; and
the fourth memory die coupled to the third memory die via a second pair of internal data links.

9. A method, comprising:
during a first portion of a burst length:
sending a signal indicative of first data from a first memory die via a first external data link; and
sending a signal indicative of third data from a third memory die via a second external data link;
during a second portion of the burst length:
sending a signal indicative of second data stored in a second memory die from the first memory die via the first external data link; and
sending a signal indicative of fourth data stored in a fourth memory die from the third memory die via the second external data link;
during a third portion of the burst length:
sending a signal indicative of fifth data from the first memory die via the first external data link; and
sending a signal indicative of seventh data from the third memory die via the second external data link; and
during a fourth portion of the burst length:
sending a signal indicative of sixth data stored in the second memory die from the first memory die via the first external data link; and
sending a signal indicative of eighth data stored in the fourth memory die from the third memory die via the second external data link.

10. The method of claim 9, further comprising:
during the first portion of the burst length:
sending a signal indicative of the second data from the second memory die to the first memory die a via a first internal data link; and
sending a signal indicative of the fourth data from the fourth memory die to the third memory die via a second internal data link; and
during the third portion of the burst length:
sending a signal indicative of the sixth data from the second memory die to the first memory die via the first internal data link; and
sending a signal indicative of the eighth data from the fourth memory die to the third memory die via the second internal data link.

11. The method of claim 9, further comprising receiving power at the first memory die via a command/address (CA) link.

12. The method of claim 11, further comprising receiving a CA signal at the first memory die via the CA link.

13. The method of claim 11, further comprising receiving power from the first memory die at the second memory die via a second CA link;
receiving power from the second memory die at the third memory die via a third CA link; and
receiving power from the third memory die at the fourth memory die via a fourth CA link.

14. The method of claim 13, further comprising receiving a first CA signal at the first memory die via the CA link;
receiving a second CA signal at the second memory die via the CA link and the second CA link;
receiving a third CA signal at the third memory die via the CA link, the second CA link, and the third CA link; and
receiving a fourth CA signal at the fourth memory die via the CA link, the second CA link, the third CA link, and the fourth CA link.

15. The method of claim 9, further comprising sending the signals indicative of the first, second, third, fourth, fifth, sixth, seventh, and eighth data without including a timing bubble between the first, the second, the third, or the fourth portions of burst.

* * * * *